United States Patent

Slipy et al.

[11] Patent Number: 5,955,700
[45] Date of Patent: Sep. 21, 1999

[54] HOUSING UNIT INCLUDING A LATCHING MECHANISM WITH A CAM

[75] Inventors: Michael John Slipy, Plantation, Fla.; Sang Oh, Palatine, Ill.

[73] Assignee: Motorola, Inc., Schaumburg, Ill.

[21] Appl. No.: 09/000,728

[22] Filed: Dec. 30, 1997

[51] Int. Cl.⁶ ................................................. H02G 3/14
[52] U.S. Cl. .................... 174/50; 174/66; 361/726; 361/747; 361/759; 220/241; 220/3.8
[58] Field of Search ................. 174/52.1, 66, 56; 361/683, 747, 759, 726, 814; 70/58, 66, 73; 220/241

[56] References Cited

U.S. PATENT DOCUMENTS

| | | | |
|---|---|---|---|
| 3,752,900 | 8/1973 | Harrison et al. | 173/52 R |
| 4,286,353 | 9/1981 | Roche | 16/143 |
| 4,597,699 | 7/1986 | Ramunas | 409/232 |
| 5,737,189 | 4/1998 | Kammergard et al. | 361/726 |

*Primary Examiner*—Dean A. Reichard
*Assistant Examiner*—Ronnie M. Mancho
*Attorney, Agent, or Firm*—John J. Oskorep; Rolland R. Hackbart

[57] ABSTRACT

A housing unit (302) includes a latching mechanism (106) having a cylindrical head (202), a cylindrical rod (204), a cam (206), and a catch (208). The latching mechanism (106) is rotatably mounted in the housing unit (302). The catch (208) and a cam surface (216) of the cam (206) are rotatably exposable through an opening (164) on the housing unit (302) and the cylindrical head (202) is exposed through a circular opening (314) on the housing unit (302). When a battery door cover (102) meets with the housing unit (302) for attachment, a catch (118) of the battery door cover (102) rides the cam surface (216) to rotate the latching mechanism (106) until the catch (208) locks with the catch (118).

18 Claims, 3 Drawing Sheets

HOUSING UNIT INCLUDING A LATCHING MECHANISM WITH A CAM

FIELD OF THE INVENTION

The present invention relates generally to the field of housing units having latching mechanisms.

BACKGROUND OF THE INVENTION

Housing units for portable electronic devices are known in the art. Typically, two or more housing units are mechanically attached with screws, snaps, or friction-fittings. Housing units attached with screws typically provide a secure attachment but take much time to attach and detach. The quality of such attachment may be poor since one or more of the several screws required may be missing or may not be fully fastened. Housing units attached with snaps provide for either a secure attachment with a difficult removal or a weak attachment with a relatively easy removal.

Many latching mechanisms devised for housing units are subject to the same tradeoffs. For example, one conventional latching mechanism includes a torsionally pivotable catch having a button for detachment. Here, a force, such as a "drop force" experienced by the units when dropped, may easily detach the housing units. Other latching mechanisms may be more complex, and undesirably require more time to assemble on the housing unit or cosmetically detract from the appearance of the housing unit.

Accordingly, what is needed is a housing unit with a latching mechanism that provides for a relatively effortless attachment with another housing unit, and one especially that provides for a strong attachment and simple assembly in a portable electronic device.

DETAILED DESCRIPTION OF THE PREFERRED EMBODIMENTS

As described herein, a first housing unit includes a latching mechanism having a rod, a cam, a first catch, and a positioning member. The latching mechanism is rotatably mounted in the first housing unit. The first catch and a cam surface of the cam are rotatably exposable through a first opening on the first housing unit and the positioning member is exposed through a second opening on the first housing unit. For attachment, a second catch of a second housing unit is ridable on the cam surface to rotate the latching mechanism such that the first catch locks with the second catch.

Figure 1:
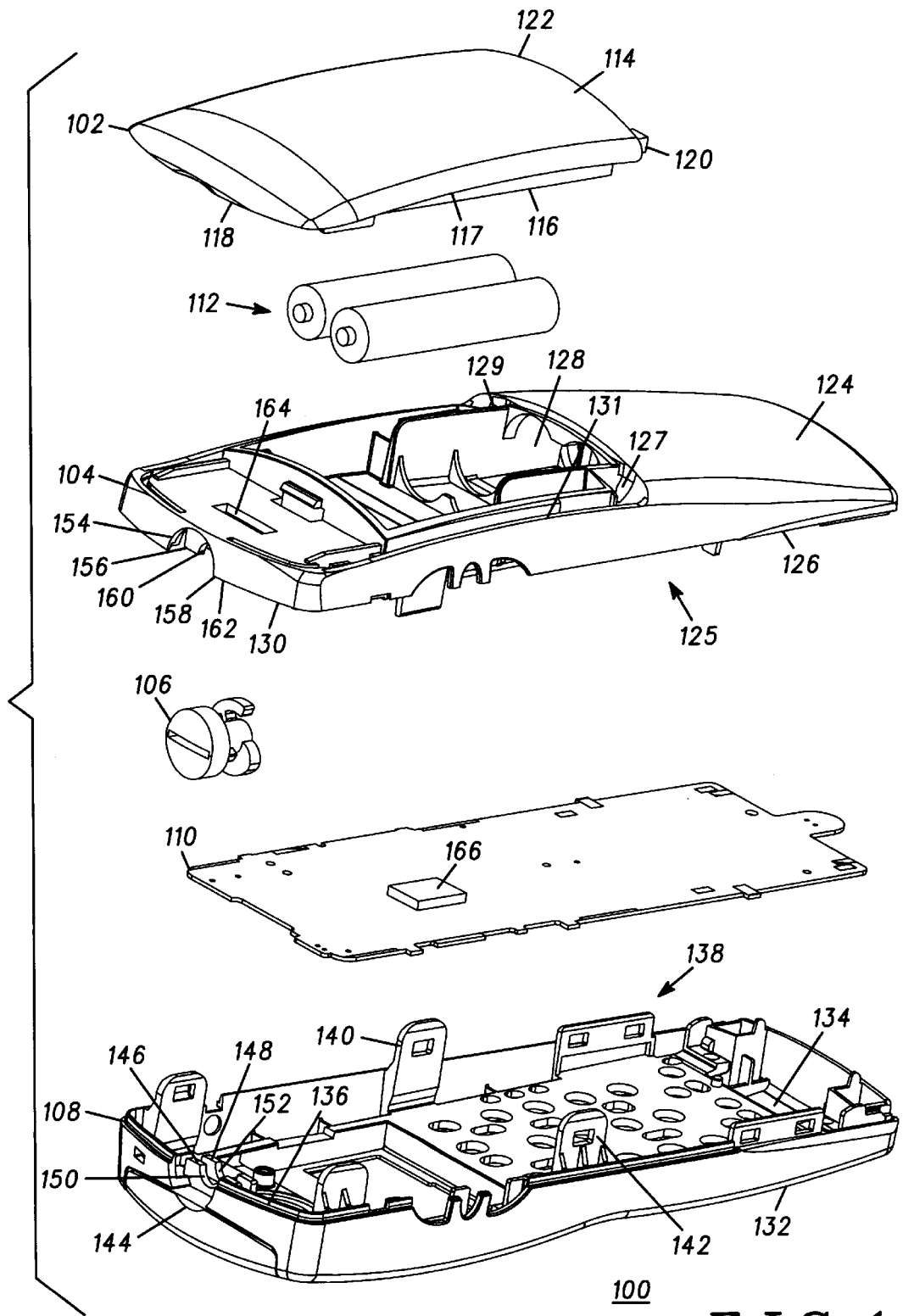
FIG. 1 shows an exploded view of a portable electronic device embodying the present invention.

FIG. 1 shows an exploded view of a portable electronic device 100. Portable electronic device 100 includes a battery door cover 102, a housing shell 104, a latching mechanism 106, a housing shell 108, and a substrate 110. Battery door cover 102 has an outside surface 114, an inside surface 116, and a mating perimeter 117 formed therearound. A catch 118 (visible in FIG. 3) is positioned on inside surface 116 near one end of battery door cover 102, and tabs 120 and 122 are positioned on inside surface 116 near and extending outward from the other end of battery door cover 102. In this embodiment, catch 118 forms an L-shaped catch or hook.

Housing shell 104 has an outside surface 124, an inside surface 126, a battery compartment recess 128, slots 127 and 129 within battery compartment recess 128, a mating perimeter 130, a mating perimeter 131, and tabs 125 (not visible). Battery compartment recess 128 is formed on outside surface 124 and is sized and constructed to fit batteries 112. Preferably, battery compartment recess 128 is sized to fit two AA-size batteries. Mating perimeter 131 is sized and shaped to meet mating perimeter 117 of battery door cover 102 when juxtaposed therewith.

Housing shell 108 has an outside surface 132, an inside surface 134, a mating perimeter 136, and snaps 138 including snaps 140 and 142. Mating perimeter 136 is sized and shaped to meet mating perimeter 130 of housing shell 104 when juxtaposed therewith. Housing shell 108 is sized to fit substrate 110 along inside surface 134. Substrate 110, which here is a printed circuit board (PCB), has electronic circuitry and components disposed thereon, such as an electronic component 166. The electronic circuitry and components are powered with electrical energy from batteries 112 when portable electronic device 100 is fully assembled.

Housing shell 108 forms a semicircular notch 144 along a portion of mating perimeter 136. Ribs 146 and 148 are formed on inside surface 134, each having a substantially rectangular shape and extending outwards from inside surface 134. A semicircular notch 150 is formed along a portion of a top end of rib 146, and a semicircular notch 152 is formed along a portion of a top end of rib 148. Semicircular notches 144, 150 and 152 are formed on housing shell 108 such that they are substantially concentric.

Likewise, housing shell 104 forms a semicircular notch 154 along a portion of mating perimeter 130. Similar to ribs 146 and 148, ribs 156 and 158 are formed on inside surface 126. Each of ribs 156 and 158 have a substantially rectangular shape and extend outwards from inside surface 126. Similar to semicircular notches 150 and 152, a semicircular notch 160 is formed along a portion of a top end of rib 156 and a semicircular notch 162 is formed along a portion of a top end of rib 158. Semicircular notches 154, 160, and 162 are formed on housing shell 104 such that they are substantially concentric. Housing shell 104 also defines an opening 164 within mating perimeter 131 and adjacent rib 158.

Figure 2:
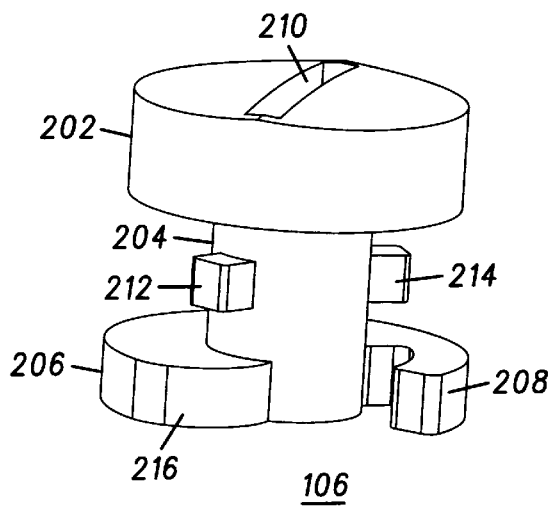
FIG. 2 shows a perspective view of a latching mechanism of the portable electronic device.

FIG. 2 is a perspective view of latching mechanism 106. Latching mechanism 106 includes a cylindrical head 202, a cylindrical rod 204, a cam 206, and a catch 208. Cylindrical head 202 is integrally connected to one end of cylindrical rod 204, and cam 206 is integrally connected to the other end of cylindrical rod 204. Cylindrical head 202 has a slot 210 formed on a top surface thereof, and cam 206 defines a cam surface 216. Catch 208 forms an L-shaped catch or hook integrally connected to cam 206 and axially extending around an axis of cylindrical rod 204. Latching mechanism 106 also includes a stop rib 212 integrally connected to and radially extending from cylindrical rod 204, and a stop rib 214 integrally connected to and radially extending from cylindrical rod 204.

Figure 3:
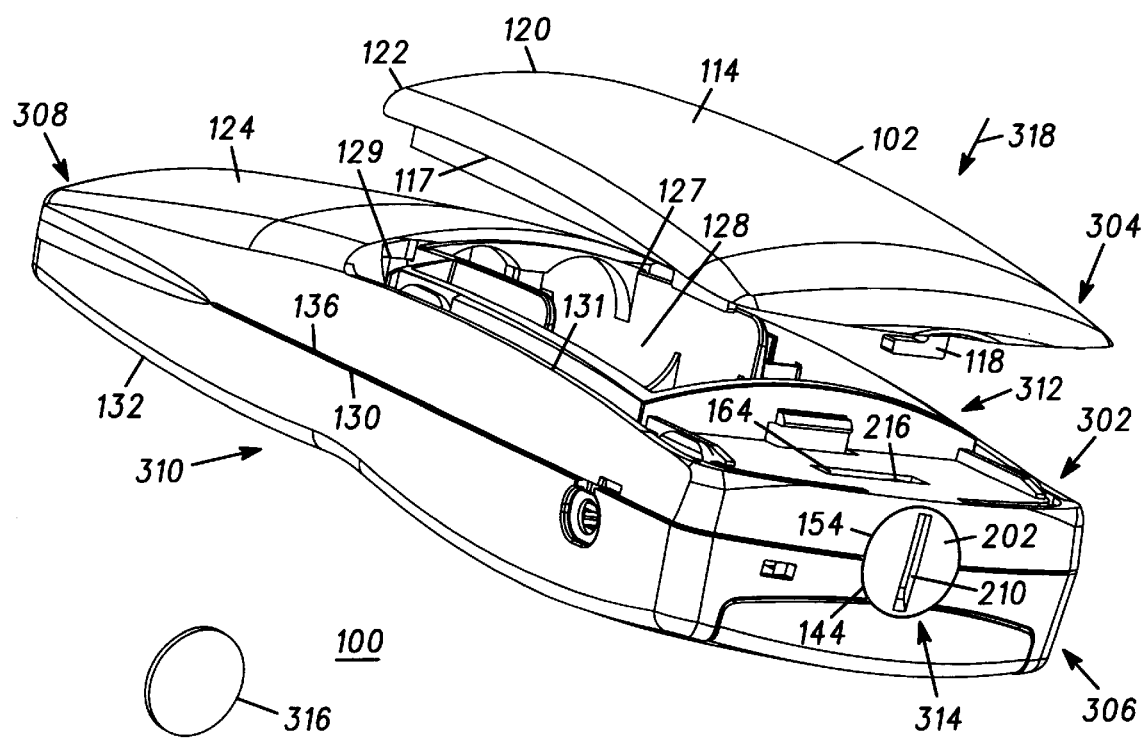
FIG. 3 shows a perspective view of the portable electronic device when partially assembled.

As shown in FIG. 3, housing shells 104 and 108 are sized and constructed to mate and form a housing unit 302 for portable electronic device 100 when assembled. Here, housing unit 302 forms a top end 306, a bottom end 308, a left side 310, and a right side 312. Battery door cover 102 may also be referred to as a housing unit 304. Battery door cover 102 is attachable to and detachable from housing unit 302 with the assistance of latching mechanism 106.

Housing shells 104 and 108, battery door cover 102, and latching mechanism 106 are made from a durable material, such as plastic. Preferably, housing units 302 and 304 and latching mechanism 106 are made from LEXAN™ polycarbonate, manufactured by General Electric, Inc.

In the embodiment shown, housing unit 302 is sized and constructed for use in a portable radio communication device, such as a two-way radio or a cordless or cellular telephone, using radio frequency (RF) signals for wireless communication. The electronic circuitry and components in housing unit 302 include a transceiver and a controller disposed on substrate 110, and a microphone and a speaker (not shown). Housing unit 302 is sized for hand-held use, preferably having a length of about 15 cm, a width of about 5 cm, and a depth of about 2.5 cm.

Portable electronic device 100 may be assembled as follows. Referring to FIGS. 1 and 2 in combination, latching mechanism 106 is positioned on housing shell 108 such that cylindrical head 202 rests adjacent to rib 146 and semicircular notch 144, cylindrical rod 204 rests on ribs 146 and 148 within semicircular notches 150 and 152, and stop ribs 212 and 214 rest between ribs 146 and 148. Substrate 110 is positioned in housing shell 108 along and parallel to inside surface 134. Housing shell 104 is positioned toward housing shell 108 such that mating perimeters 130 and 136 meet to form housing unit 302 of FIG. 3, where a "snap" lock attachment is provided between snaps 138 and tabs 125.

Semicircular notches 144 and 154 meet to form a circular opening 314 (FIG. 3) exposing cylindrical head 202 and slot 210. Similarly, semicircular notches 150 and 160 and semicircular notches 152 and 162 of FIG. 1 meet to form circular openings (not visible) through which cylindrical rod 204 is disposed. With a slight friction fit, cylindrical rod 204 is rotatably captured between semicircular notches 150 and 160 and semicircular notches 152 and 162 and within the circular openings formed therefrom. Thus, latching mechanism 106 is rotatably mounted along a longitudinal axis of housing unit 302. Cam surface 216 and catch 208 are rotatably exposable through and positionable adjacent to opening 164. The top surface of cylindrical head 202 is substantially flush with top end 306 of housing unit 302.

In the embodiment shown, cylindrical rod 204 has a cylindrical rod diameter about equal to each circular opening diameter of the circular openings formed by semicircular notches 150 and 160 and semicircular notches 152 and 162. Cylindrical head 202 has a cylindrical head diameter about equal to a circular opening diameter of circular opening 314 and greater than the circular opening diameter of the circular opening formed by semicircular notches 150 and 160. Cam 206 has a cam diameter greater than the circular opening diameter of the circular opening formed by semicircular notches 152 and 162.

Stop ribs 212 and 214 inhibit full rotational movement of latching mechanism 106. When latching mechanism 106 is rotated in a clockwise direction (relative to a user of portable electronic device 100), abutment occurs between stop rib 212 and a portion of inside surface 134 between ribs 146 and 148, thereby inhibiting a full rotational movement in the clockwise direction. Likewise, when latching mechanism 106 is rotated in a counterclockwise direction, abutment occurs between stop rib 214 and another portion of inside surface 134 between ribs 146 and 148, thereby inhibiting a full rotational movement in the counterclockwise direction. Here, stop ribs 212 and 214 limit rotational movement of latching mechanism 106 with a range of about ninety degrees.

Figure 4:
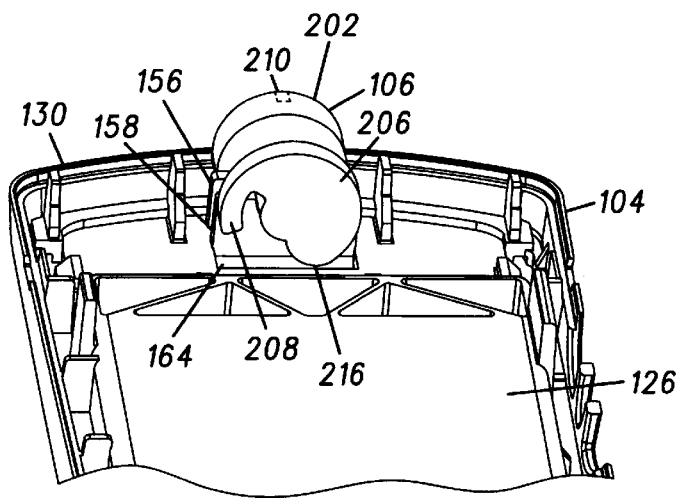
FIG. 4 shows the latching mechanism rotatably disposed on a housing shell of the portable electronic device, where the latching mechanism is situated for an unlocked configuration.
Figure 5:
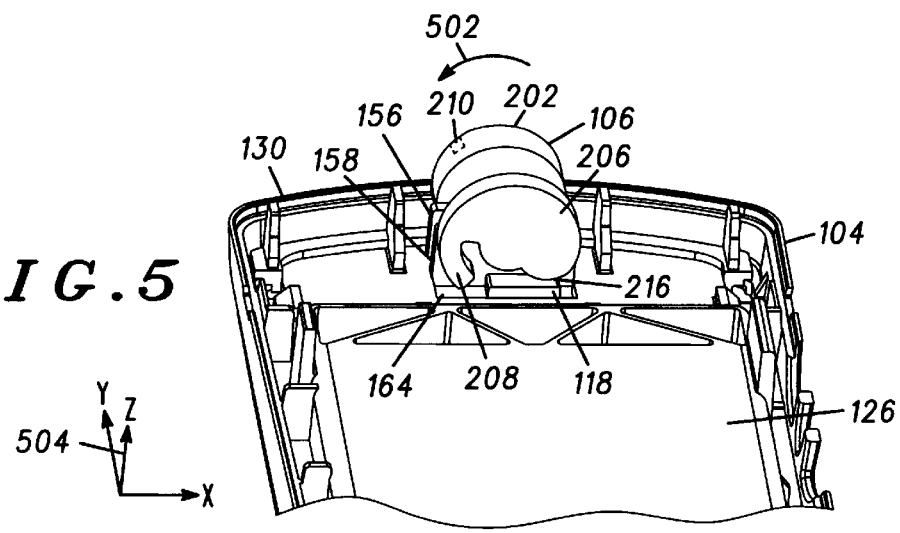
FIG. 5 shows the latching mechanism rotatably disposed on the housing shell, where the latching mechanism is situated between the unlocked configuration and a locked configuration.
Figure 6:
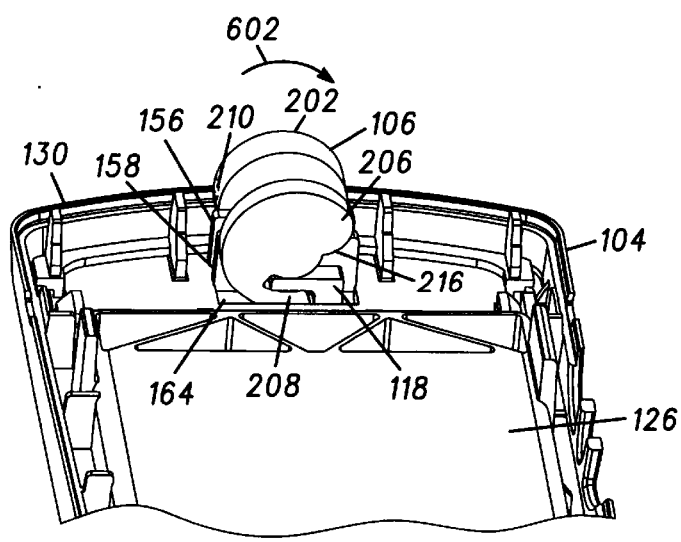
FIG. 6 shows the latching mechanism rotatably disposed on the housing shell, where the latching mechanism is situated for the locked configuration.

FIGS. 4–6 show rotatable positions of latching mechanism 106 on a portion of housing shell 104, positions useful for understanding the movable nature of latching mechanism 106 when housing unit 302 is assembled. More specifically, FIG. 4 shows latching mechanism 106 positioned for an unlocked configuration between housing unit 302 and battery door cover 102; FIG. 6 shows latching mechanism 106 positioned for a locked configuration between housing unit 302 and battery door cover 102; and FIG. 5 shows latching mechanism 106 positioned in between the locked and the unlocked configurations.

Battery door cover 102 may be attached to housing unit 302 as follows. As shown in FIGS. 3 and 4, latching mechanism 106 is situated for the unlocked configuration where cam surface 216 is visibly exposed through opening 164 and slot 210 is perpendicular to mating perimeters 130 and 136. Tabs 120 and 122 of battery door cover 102 are inserted in slots 127 and 129, respectively, of housing unit 302. Battery door cover 102 is pivoted or folded toward housing unit 302 such that catch 118 is positioned toward opening 164, in a direction generally indicated by an arrow 318 of FIG. 3.

Upon further positioning of battery door cover 102, catch 118 begins to slightly protrude through opening 164 where a surface of catch 118 makes contact with cam surface 216. Catch 118 rides cam surface 216 and begins to rotate latching mechanism 106 such that catch 208 is rotated closer toward opening 164, as shown in FIG. 5. While catch 118 is positioned in a direction generally indicated by an arrow 504 of FIG. 5, latching mechanism 106 is rotated in a clockwise direction (relative to a user of portable electronic device 100) indicated by an arrow 502 of FIG. 5.

Catch 118 rides cam surface 216 further until catch 208 engages and locks with catch 118, as shown in FIG. 6. Thus, battery door cover 102 is "automatically" locked to housing unit 302 upon attachment. Mating perimeters 117 and 131 mate, and inside surface 116 meets or aligns with outside surface 124. Stop rib 212 makes contact with the portion of inside surface 134 to inhibit further rotation of latching mechanism 106. Slot 210 is in alignment with mating perimeters 130 and 136 for cosmetic appeal in the locked configuration.

Battery door cover 102 may be detached from housing unit 302 as follows. An instrument, such as a coin 316 (FIG. 3) or a fingernail, is inserted in slot 210 of cylindrical head 202. The instrument is rotated to rotate latching mechanism 106 in a counterclockwise direction (relative to the user) indicated by an arrow 602 of FIG. 6. Cam surface 216 contacts and urges catch 118 outwards from opening 164, as in FIG. 5. Latching mechanism 106 is rotated further until situated for the unlocked configuration, as in FIG. 4. Stop rib 214 makes contact with the portion of inside surface 134 to inhibit further rotation of latching mechanism 106. In the unlocked configuration, battery door cover 102 is free for removal away from housing unit 302, as in FIG. 3.

As shown and described, latching mechanism 106 provides an easy locking attachment between housing units 302 and 304. When attachment is made, housing units 302 and 304 are tightly locked where a rotational movement of latching mechanism 106 is provided for detachment. When subject to a drop force, detachment is less likely to occur than with conventional latching mechanisms. Latching mechanism 106 is also easy to assemble in housing unit 302 and does not detract from the appearance of housing unit 302.

While particular embodiments of the present invention have been shown and described, modifications may be made. For example, although housing unit 302 is shown for use with a portable radio communication device, housing unit 302 may be sized and constructed for an electronic device of any suitable application. Housing unit 304 may be any suitable type of unit, such as a battery pack or an electronic device, and may include electrical contacts for coupling with electrical contacts of housing unit 302. Although it is preferred that latching mechanism 106 is rotatably mounted along a longitudinal axis of housing unit 302, latching mechanism 106 may be mounted along a traverse axis thereof. Latching mechanism 106 may also be positioned closer toward a center of housing unit 302, where circular opening 314 is unnecessary and an opening on outside surface 124 (outside of mating perimeter 131) exposes a side portion of cylindrical head 202. Although cylindrical head 202 with slot 210 is preferred, a positioning member of any suitable type may be used, such as a lever, which may radially extend from cylindrical rod 204 and be exposed through an opening on outside surface 124 (outside of mating perimeter 131). Catch 208 may extend from a different portion of cylindrical rod 204, where housing unit 302 has an opening for exposing catch 208 that is separate from opening 164 for cam 206, and where housing unit 304 includes a member for contacting cam surface 216 that is separate from catch 118. It is therefore intended in the appended claims to cover all such changes and modifications which fall within the true spirit and scope of the invention.

What is claimed is:

1. A first housing unit attachable with a second housing unit, said first housing unit comprising:
    a latching mechanism, said latching mechanism including a rod, a cam, a first catch, and a positioning member, said latching mechanism rotatably mounted in said first housing unit, said first catch and a cam surface of said cam rotatably exposable through a first opening on said first housing unit, said positioning member exposed through a second opening on said first housing unit, where a second catch of the second housing unit is ridable on said cam surface to rotate said latching mechanism such that said first catch locks with the second catch.

2. The first housing unit according to claim 1, wherein said first housing unit comprises a portable electronic device.

3. The first housing unit according to claim 1, further comprising:
    a circular opening in said first housing unit through which said rod is rotatably mounted.

4. The first housing unit according to claim 1, wherein said latching mechanism further includes a first stop rib radially extending from said rod.

5. The first housing unit according to claim 1, wherein said latching mechanism is rotatably mounted along a longitudinal axis of said first housing unit.

6. The first housing unit according to claim 1, wherein said positioning member comprises a cylindrical head.

7. The first housing unit according to claim 1, further comprising:
    a substrate, said substrate disposed in said first housing unit; and
    an electronic component, said electronic component disposed on said substrate.

8. An electronic device, comprising:
    first housing unit, said first housing unit defining a first surface;
    a latching mechanism, said latching mechanism including a rod, a cam, a first catch, and a positioning member, said latching mechanism rotatably mounted in said first housing unit, said first catch and a cam surface of said cam rotatably exposable through a first opening on said first surface, said positioning member exposed through a second opening on said first housing unit; and
    a second housing unit, said second housing unit defining a second surface and a second catch on said second surface, said second catch ridable on said cam surface to rotate said latching mechanism such that said first catch rotatably locks with said second catch when said first and said second surfaces are brought together.

9. The electronic device according to claim 8, wherein said latching mechanism is rotatably mounted along a longitudinal axis of said first housing unit.

10. The electronic device according to claim 8, wherein said positioning member comprises a cylindrical head.

11. The electronic device according to claim 8, wherein said second catch comprises an L-shaped catch.

12. The electronic device according to claim 8, wherein a first circular opening is formed within said first housing unit through which said rod is rotatably mounted.

13. The electronic device according to claim 8, wherein said second housing unit comprises a battery door cover, said electronic device further comprising:
    a battery compartment recess, said battery compartment recess formed on said first surface, said battery compartment recess being covered by said battery door cover when attached.

14. The electronic device according to claim 8, further comprising:
    a substrate, said substrate disposed within said first housing unit; and
    an electronic component, said electronic component disposed on said substrate.

15. The electronic device according to claim 8, wherein said first housing unit includes a first housing shell and a second housing shell, said first housing shell defining a first mating perimeter and said second housing shell defining a second mating perimeter, said first housing shell defining a first semicircular notch along a portion of said first mating perimeter, said second housing shell defining a second semicircular notch along a portion of said second mating perimeter, said first and said second housing shells to mate along said first and said second mating perimeters such that said first and said second semicircular notches form said second opening.

16. A portable electronic device, comprising:
    a first housing shell, said first housing shell defining a first inside surface, a first outside surface, and a first mating perimeter, said first housing shell forming a first semicircular notch along a portion of said first mating perimeter, said first housing shell having a first rib positioned on said first inside surface and a second semicircular notch formed along a portion of said first rib;
    a second housing shell, said second housing shell defining a second inside surface, a second outside surface, and a second mating perimeter, said second housing shell forming a third semicircular notch along a portion of said second mating perimeter, said second housing shell having a second rib positioned on said second inside surface and a fourth semicircular notch formed along a portion of said second rib, said second housing shell defining an opening and a battery compartment recess on said second outside surface, said first and said second mating perimeters configured to mate such that said first and said second housing shells form a housing unit where said first and said third semicircular notches form a first circular opening and said second and said fourth semicircular notches form a second circular opening concentric with said first circular opening, said second circular opening having a second circular opening diameter;

a latching mechanism, said latching mechanism having a cylindrical head, a cylindrical rod, a cam, and a first L-shaped catch, said cylindrical head positioned on a first end of said cylindrical rod and said cam positioned on a second end of said cylindrical rod, said cylindrical rod having a cylindrical rod diameter about equal to said second circular opening diameter, said latching mechanism mounted in said housing such that said cylindrical rod is rotatably captured between said second and said fourth semicircular notches, said cylindrical head is exposed through said first circular opening, and said first L-shaped catch and a cam surface of said cam are rotatably exposable through said opening; and a battery door cover, said battery door cover defining a third mating perimeter configured to mate with a fourth mating perimeter around said battery compartment recess, said battery door cover including a second L-shaped catch, said second L-shaped catch configured such that when said battery door cover is positioned toward said battery compartment recess for attachment, said second L-shaped catch rides said cam surface to rotate said latching mechanism until said first L-shaped catch rotatably locks with said second L-shaped catch.

17. The portable electronic device according to claim 16, wherein said first circular opening is formed on a top end of said housing unit.

18. The portable electronic device according to claim 16, wherein said latching mechanism includes a first stop rib and a second stop rib radially extending from said cylindrical rod.

* * * * *